(12) United States Patent
Czebiniak

(10) Patent No.: US 11,367,971 B2
(45) Date of Patent: Jun. 21, 2022

(54) BUSBAR INSULATOR INTERFACE AND BUSBAR ASSEMBLY

(71) Applicant: BAE Systems Controls Inc., Endicott, NY (US)

(72) Inventor: David J. Czebiniak, Newark Valley, NY (US)

(73) Assignee: BAE Systems Controls Inc., Endicott, NY (US)

( * ) Notice: Subject to any disclaimer, the term of this patent is extended or adjusted under 35 U.S.C. 154(b) by 161 days.

(21) Appl. No.: 16/886,909

(22) Filed: May 29, 2020

(65) Prior Publication Data

US 2021/0376503 A1    Dec. 2, 2021

(51) Int. Cl.
| | |
|---|---|
| *H01R 3/00* | (2006.01) |
| *H01R 12/52* | (2011.01) |
| *H05K 1/14* | (2006.01) |
| *H01R 11/11* | (2006.01) |
| *H01R 12/70* | (2011.01) |

(52) U.S. Cl.
CPC ............ *H01R 12/52* (2013.01); *H01R 11/11* (2013.01); *H01R 12/7076* (2013.01); *H05K 1/147* (2013.01); *H05K 2201/10272* (2013.01); *H05K 2201/10409* (2013.01)

(58) Field of Classification Search
CPC .... H01R 12/52; H01R 12/7076; H01R 11/11; H05K 1/147; H05K 2201/10272; H05K 2201/10409
USPC ......................................................... 439/493
See application file for complete search history.

(56) References Cited

U.S. PATENT DOCUMENTS

| | | |
|---|---|---|
| 5,044,967 A | 9/1991 | Takano |
| 5,281,150 A | 1/1994 | Bundga et al. |
| 5,742,484 A | 4/1998 | Gillette et al. |
| 6,031,730 A | 2/2000 | Kroske |
| 6,537,083 B1 | 3/2003 | Yatskov et al. |
| 6,855,013 B2 | 2/2005 | Chiang et al. |
| 7,878,842 B2 | 2/2011 | Jia et al. |
| 8,859,897 B2 | 10/2014 | Hadi et al. |
| 9,358,936 B2 | 6/2016 | Adachi et al. |
| 9,397,328 B2 | 7/2016 | Chorian et al. |
| 9,414,493 B2 | 8/2016 | Doering et al. |
| 9,853,435 B1 | 12/2017 | Burkman |
| 10,361,491 B2 | 7/2019 | Castonguay et al. |

(Continued)

OTHER PUBLICATIONS

International Search Report, PCT/US21/33953, dated Sep. 10, 2021, 9 pages.

*Primary Examiner* — Khiem M Nguyen
(74) *Attorney, Agent, or Firm* — Scully Scott Murphy & Presser PC; Scott J. Asmus

(57) ABSTRACT

An insulator interface serves as both an insulator and the forming tool for a busbar. The busbar insulator interface includes a hollow riser having at least one channel extending between first and second openings at opposite ends of the riser, a busbar forming section located at one of the first and second openings of the riser and a terminal locating section extending from the busbar forming section, wherein the busbar forming section is configured for folding a busbar onto the terminal locating section. A busbar assembly includes a combination of a single piece busbar and an insulator interface. The busbar has one end pre-formed and other end straight to allow the busbar to pass through the insulator interface. The busbar insulator interface is designed to act as the forming tool with the proper bend radius for the busbar.

20 Claims, 7 Drawing Sheets

(56) References Cited

U.S. PATENT DOCUMENTS

| | | |
|---|---|---|
| 2013/0217262 A1 | 8/2013 | Ikeda et al. |
| 2015/0173183 A1 | 6/2015 | Holec et al. |
| 2016/0141772 A1 | 5/2016 | Yamauchi et al. |
| 2017/0117675 A1 | 4/2017 | Itou |
| 2018/0205160 A1 | 7/2018 | Boisnier et al. |
| 2019/0305446 A1 | 10/2019 | Kawamura et al. |

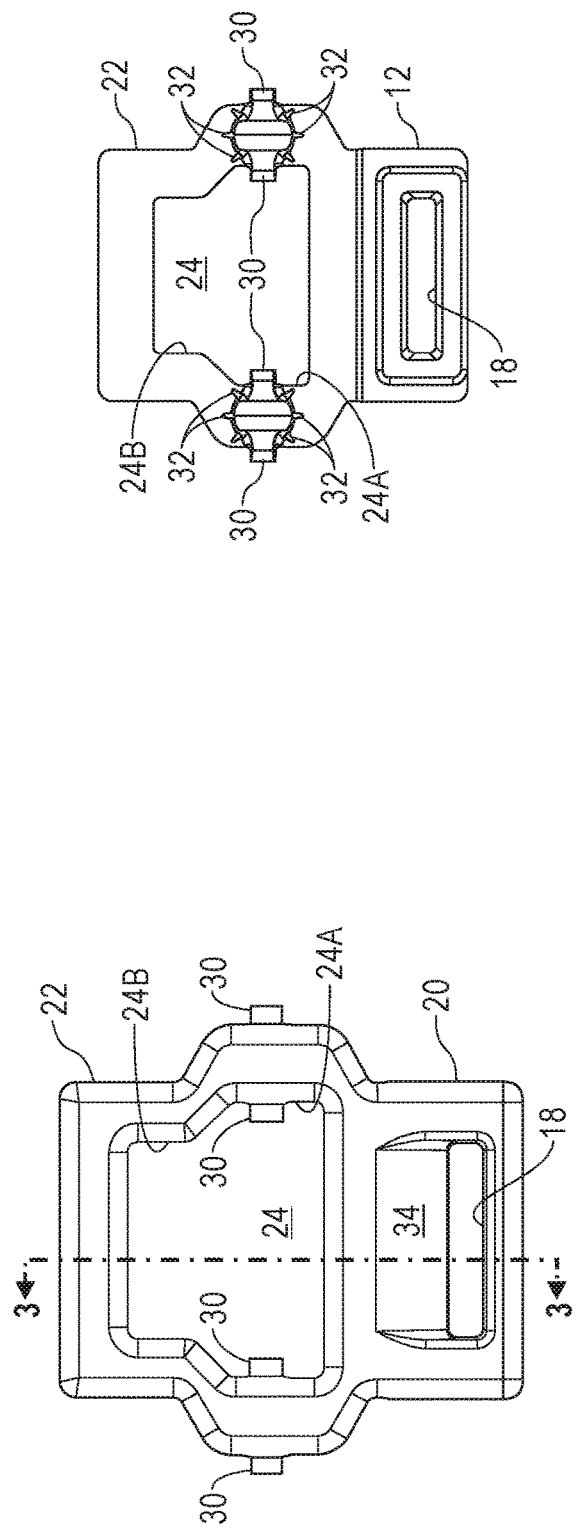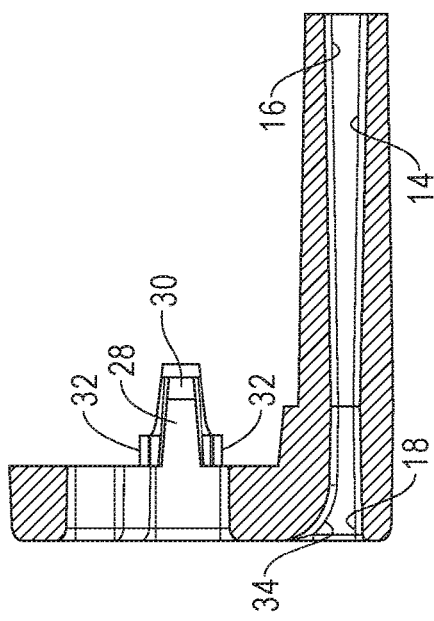

BUSBAR INSULATOR INTERFACE AND BUSBAR ASSEMBLY

BACKGROUND

The present disclosure is directed to a busbar insulator and more particularly to an insulator for a busbar establishing an electrical connection between two circuit boards.

Existing solutions require busbars with pre-folded angles, complex machining or other 'fixed' means of establishing a right angle connection that is completed before installation. Existing flexible busbars consist of many different layers and sleeving or braiding. Alternatively the use of a wire harness with connectors can also achieve the end result but with a more complex solution. All of these items listed are more costly than the proposed solution. In some cases they are also harder to install as the pre-defined shape needs to feed into the design whereas the proposed solution can be 'out of the way' until it is folded into position.

BRIEF SUMMARY

In one embodiment, an insulator interface serves as both an insulator and the forming tool for a busbar. A busbar insulator interface of one embodiment includes a hollow riser having at least one channel extending between first and second openings at opposite ends of the riser, a busbar forming section located at one of the first and second openings of the riser and a terminal locating section extending from the busbar forming section, wherein the busbar forming section is configured for folding a busbar onto the terminal locating section.

One embodiment is a busbar assembly of a combination of a single piece busbar and an insulator interface. In one embodiment, the busbar has one end pre-formed and other end straight to allow the busbar to pass through the insulator interface. The busbar insulator interface is designed to act as the forming tool with the proper bend radius for the busbar. In one embodiment, the busbar assembly is used locate a busbar on an electrical assembly to make two circuits. In one embodiment, the busbar assembly is used to locate a busbar on a circuit card assembly to connect two circuit boards. The busbar extends through the insulator interface with each end of the busbar making contact with an electrical terminal on a respective circuit board. The insulator interface is used to form the busbar into its final configuration. The combination of the single piece busbar and insulator interface creates technically effective, low cost, and easy to install solution.

In one embodiment, a method of assembling two circuit boards includes inserting a single piece busbar through an insulator interface, snapping the insulator interface into a circuit card assembly comprising first and second circuit boards, bending the busbar over the insulator interface to mate a first end of the busbar with a terminal on the first circuit board and connecting a second end of the busbar to a terminal on the second circuit board.

BRIEF DESCRIPTION OF THE DRAWINGS

FIG. 2A is plan view of the insulator interface as shown of FIG. 1B.

FIG. 2B is a plan view of the insulator interface of FIG. 1A.

FIG. 3 is cross section the insulator interface taken along lines 3-3 in FIG. 2A.

Further features as well as the structure and operation of various embodiments are described in detail below with reference to the accompanying drawings. In the drawings, like reference numbers indicate identical or functionally similar elements.

DETAILED DESCRIPTION

Figure 1A:
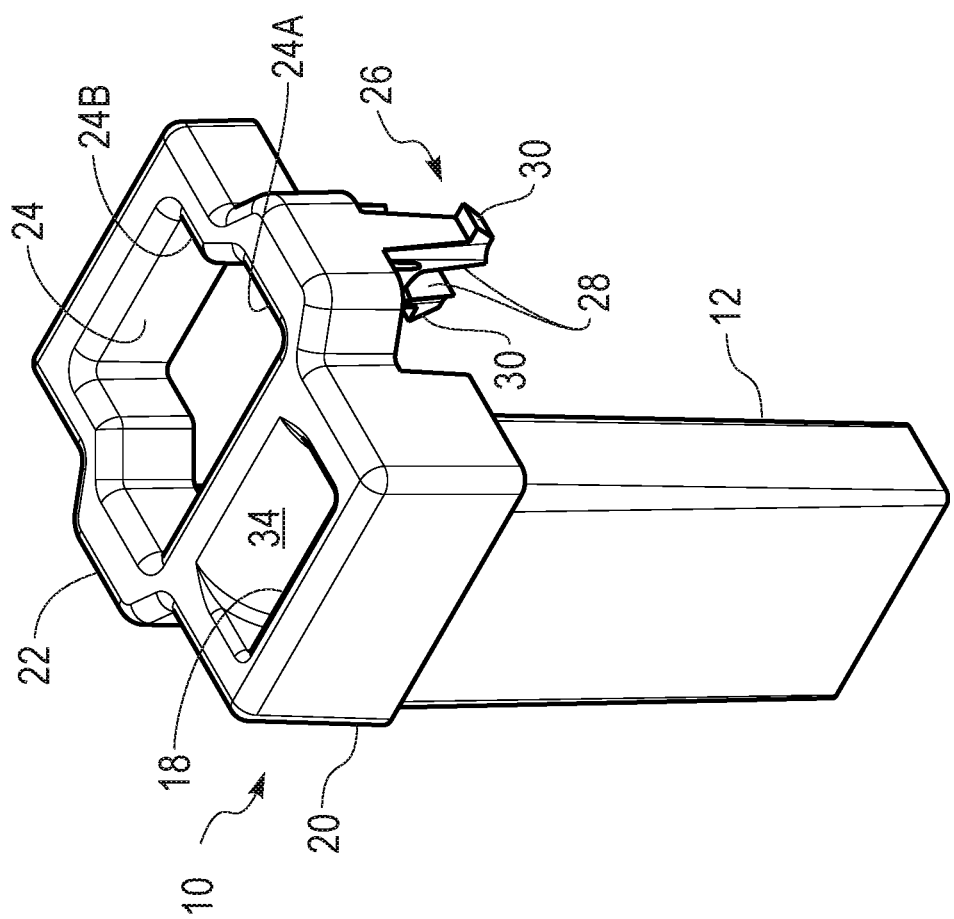
FIG. 1A is an isometric view of one embodiment of an insulator interface of the present disclosure.
Figure 1B:
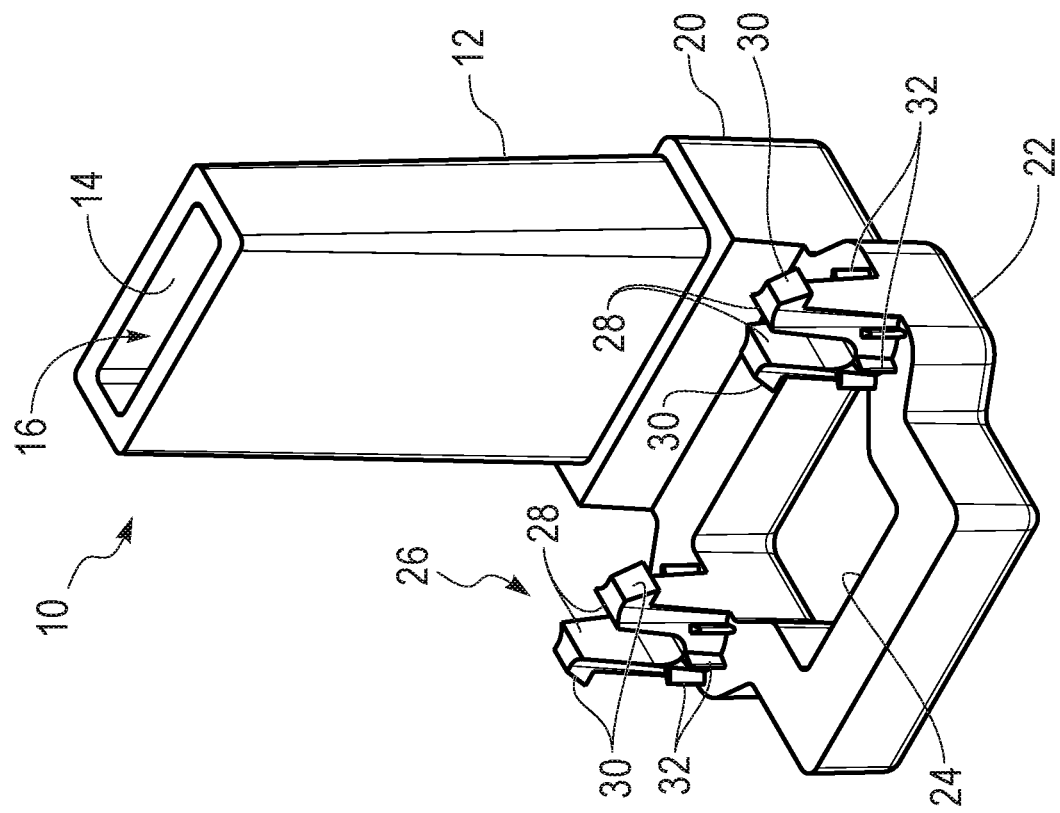
FIG. 1B is an isometric view of one embodiment of an insulator interface of the present disclosure.

FIGS. 1A and 1B are isometric views of one embodiment of an insulator interface 10. Insulator interface 10 includes a riser 12. In one embodiment, riser 12 is hollow formed with a channel 14 having a first opening 16 and second opening 18. The channel 14 extends between the first opening 16 and second opening 18. Riser 12 includes a busbar forming section 20 located on one end of riser 12. In the embodiment shown in FIGS. 1A and 1B, busbar forming section 20 is located at the end with opening 18.

The insulator interface 10 includes a terminal locating section 22 extending from the busbar forming section 20 of riser 12. In the embodiment shown in FIGS. 1A and 1B terminal locating section 22 extends at a right angle from riser 12 such that insulator interface 10 has an L-shape. However, insulator interface 10 may be formed with terminal locating section 22 extending at different angles from riser 12, where the angle will depend on the particular application. The angle may range from 0 to 180 degrees depending on how the two circuit boards are arranged with respect to each other. Terminal locating section 22 includes an aperture 24 for locating and receiving an electrical terminal that will be contacted by a busbar. The size and shape of aperture 24 can be varied to accommodate the size and shape of the electrical terminal. The shape of the aperture 24 as shown in the embodiment of FIGS. 1A and 1B has a wide section 24A and a narrow section 24B in order to allow a singe insulator interface 10 be used with electrical terminals of various sizes and shapes.

In one embodiment, the insulator interface 10 has a connector 26 for attaching the insulator interface 10 to an electrical assembly. In the embodiment shown in FIGS. 1A and 1B, connector 26 is located on the terminal locating section 22. However, connector 26 may be located on other positions on insulator interface 10, such as on riser 12. In one embodiment, connecter 26 is formed by a pair of posts 28 extending from terminal locating section 22. Each post has a boss 30 extending outward from each post 28. Each of the posts 28 extend from the terminal locating section 22 at an outward angle in opposite directions. The posts 28 are able to flex inward and spring back to the original outward angle. The posts serve to attach the insulator interface 10 to a circuit card assembly (CCA) by the posts 28 flexing inward as they pass through an opening having a diameter narrower than the width between the outer edges of the bosses and then spring back to the original angle after the bosses pass fully through the opening.

FIG. 2A is a plan view of the insulator interface 10 looking down on the upper end as shown in FIG. 1B. FIG. 2B is a plan view of the insulator interface 10 looking down on the upper end as shown in FIG. 1A. As best seen in FIG. 1A and FIG. 2B, a plurality of ribs 32 extend outward from the posts 28. In one embodiment, the ribs 32 provide a friction fit for the posts when inserted within the opening in the CCA.

FIG. 3 is cross section the insulator interface 10 taken along lines 3-3 in FIG. 2A. As can be seen in FIG. 1B, FIG. 2A and FIG. 3, a surface 34 of the channel 14, is located at the opening 18 of the busbar forming section 20. The surface 34 has an arcuate cross-sectional shape. As will be explained in more detail below, the curvature of the arcuate surface 34 provides a forming surface to fold the busbar onto the terminal locating section 22. The busbar insulator interface is therefore designed to act as the forming tool with the proper bend radius for the busbar.

Figure 4:
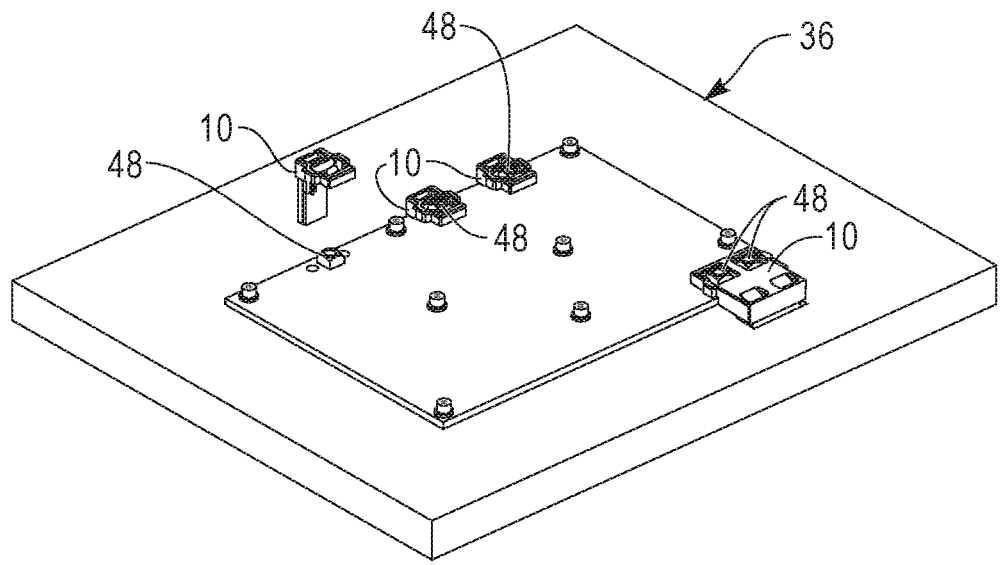
FIG. 4 is an isometric view of one embodiment of a circuit card assembly of the present disclosure.
Figure 5:
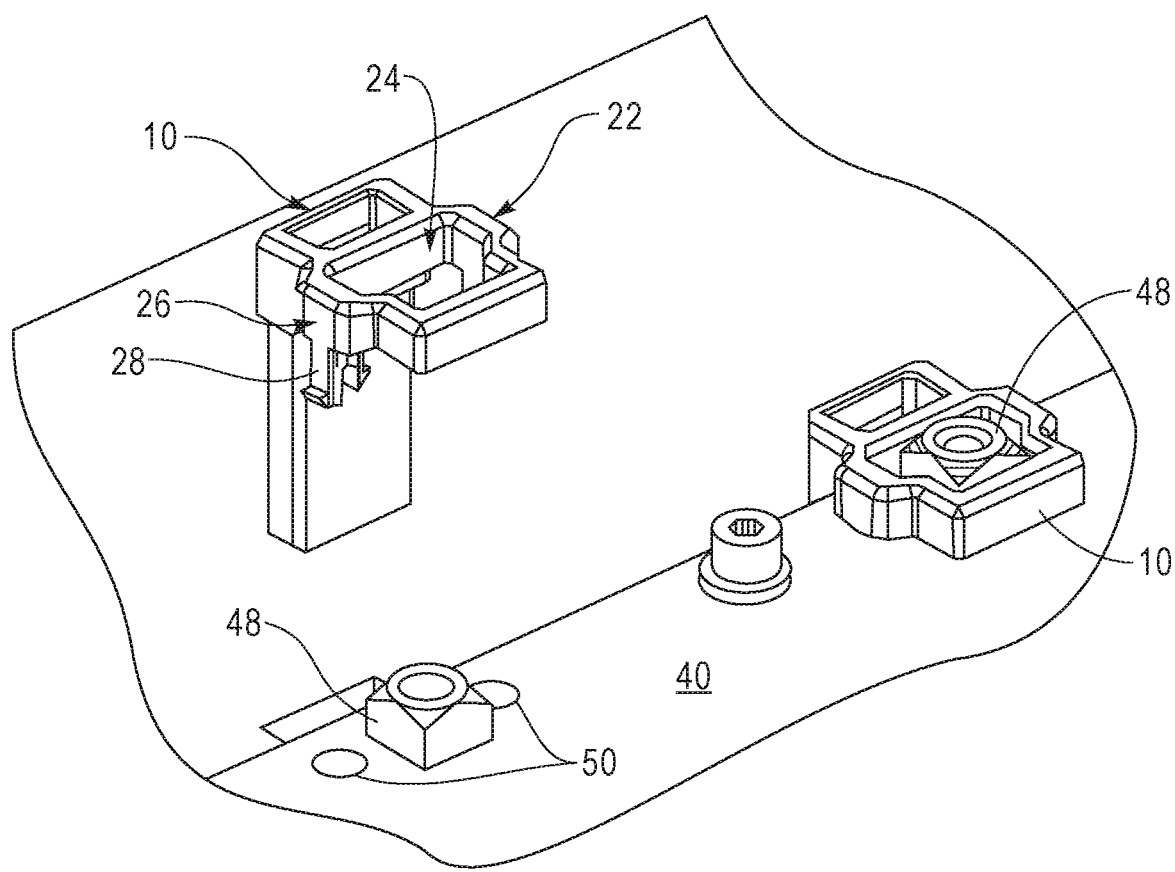
FIG. 5 is a close-up isometric view of the insulator interface outlined in the detail inset in FIG. 4.

FIG. 4 depicts a CCA 36 formed of a framework housing a first circuit board 40 and a second circuit board 42 on the opposite side of framework 36. Circuit board 42 can be seen in FIGS. 6-9. Each circuit board 40 and 42 has various integrated circuit chips and other components mounted to one side and circuitry and other components formed on the opposite side (not shown). Each circuit board 40 and 42 has a plurality of terminal connections 48 providing an electrical connection to certain circuitry on the respective circuit board. As shown in FIG. 4, circuit board 40 has four insulator interfaces 10 positioned with respect to terminal connections 48. One insulator interface 10 is shown in the inset in exploded view being readied to be positioned onto a terminal connection 48. FIG. 5 is a close-up isometric view of the insulator interface outlined in the detail inset in FIG. 4. In order to position the insulator interface 10 onto the circuit board 40, the two connectors 26 are inserted into the two openings 50 and the terminal connection 48 is located within the aperture 24 of the terminal location section 22. As described above, the posts 28 of the connector 26 flex inward as they are pass through the opening 50, which has narrower diameter than the width between the outer edges of the bosses. The angled outer surface of the bosses 30 forces the posts 28 fit into the opening 50. The posts 28 springs back to the original angle after the bosses 30 pass fully through the opening 50.

Figure 6:
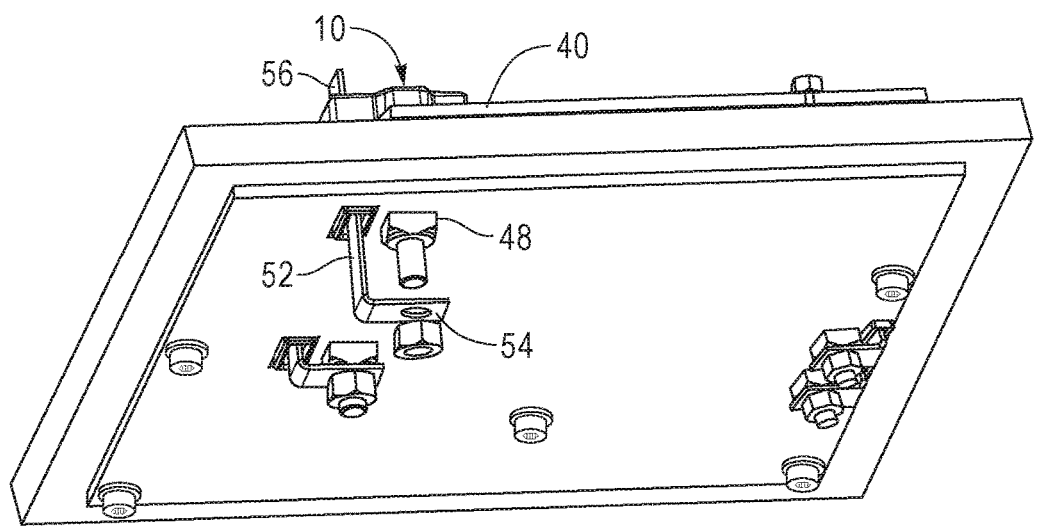
FIG. 6 is an isometric view of one embodiment of an insulator interface attached to a circuit card assembly of the present disclosure showing one connection of a busbar in exploded view.

As shown in FIG. 6, after the insulator interface 10 is snapped onto the circuit board 40, a busbar 52 is inserted through the channel 14 of riser 12. In the embodiment shown in FIG. 6, one end 54 of busbar 52 is preformed into an L shape and the opposite end 56 of busbar 52 is straight. The straight end 56 is first inserted onto opening 16 of the riser 12 and extends through and out of opening 18. Once the busbar 52 is fully inserted through the channel 14, L shaped end 54 is secured to the terminal connection 48 of circuit board 42 as best seen in FIG. 9.

Figure 7:
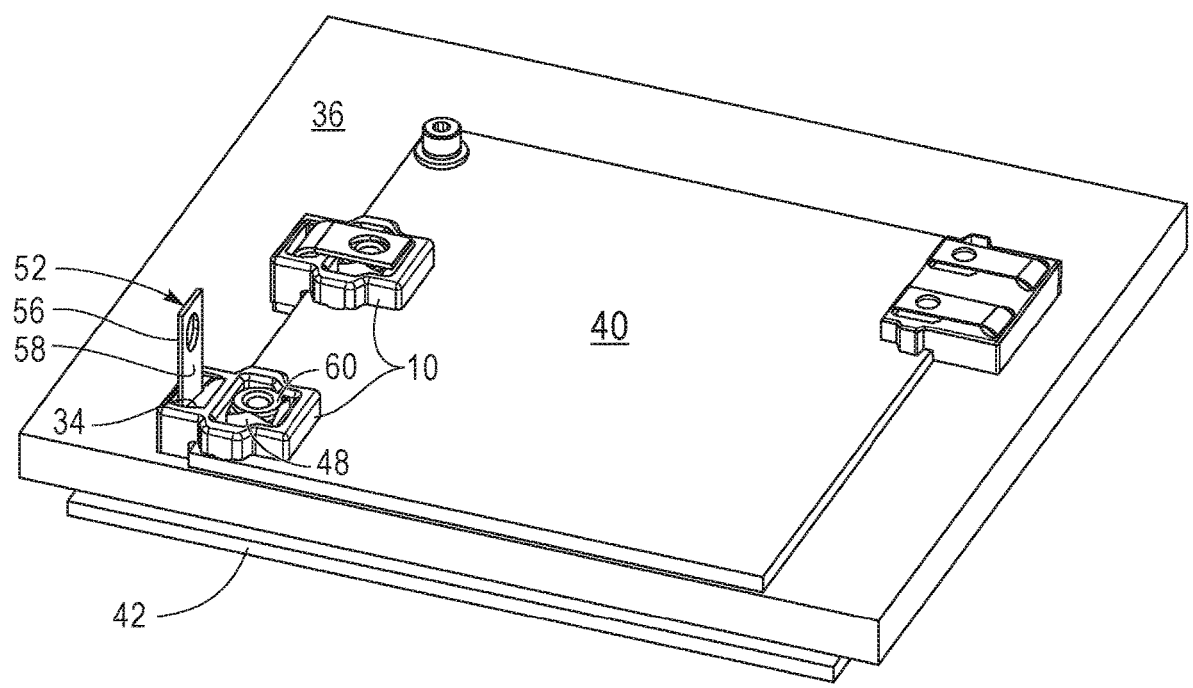
FIG. 7 is an isometric view of one embodiment of an insulator interface attached to a circuit card assembly of the present disclosure showing a busbar before being folded into place.
Figure 8:
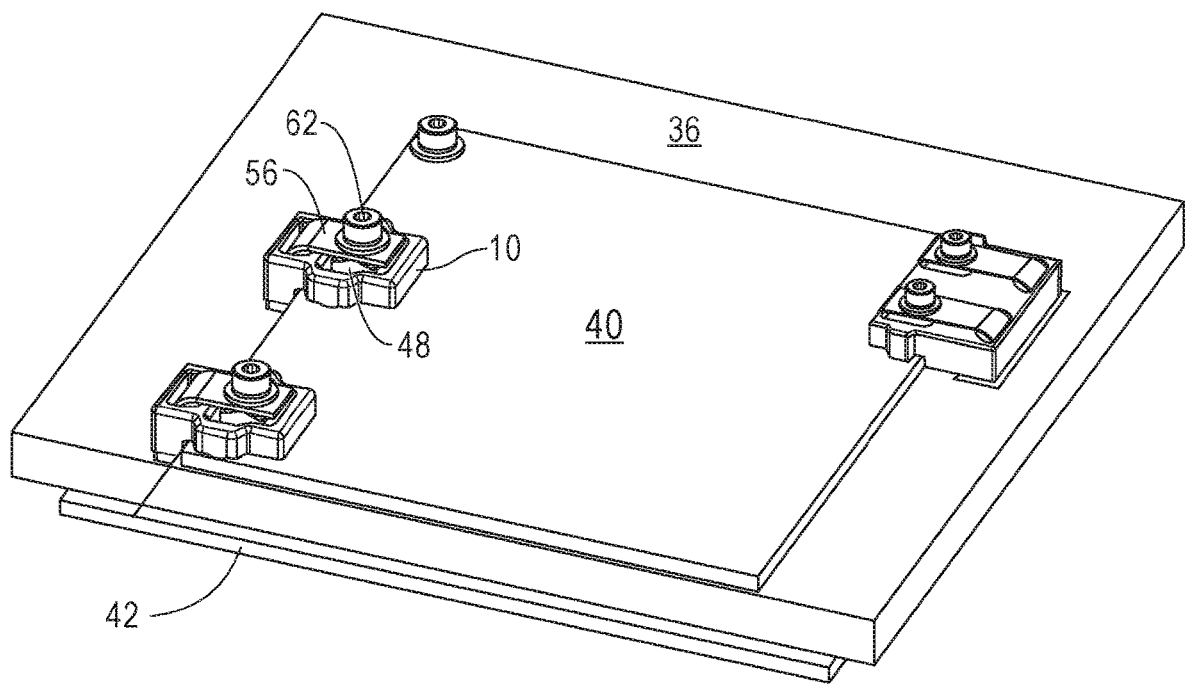
FIG. 8 is an isometric view of one embodiment of an insulator interface attached to a circuit card assembly of the present disclosure showing a busbar after being folded into place.

FIG. 7 shows the busbar 52 fully inserted through the channel 14 with straight end 56 extending above opening 18. The straight end 56 is then pressed against arcuate surface 34 and folded onto the terminal connection 48 into its final position as shown in FIG. 8. Any appropriate forming tool for bending a metal busbar may be used. The busbar 52 is then secured to terminal connection 48 using any appropriate connector such as a threaded bolt 62. The fully installed busbar 52 thereby makes an electrical connection between circuit board 40 and circuit board 42.

Figure 9:
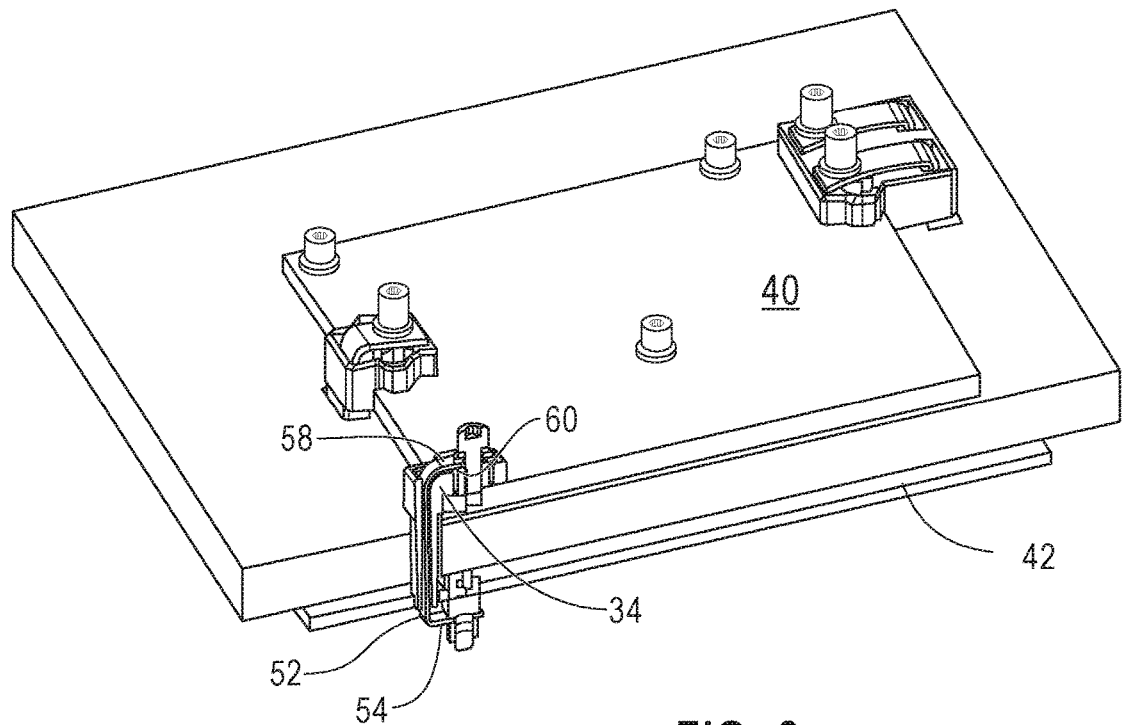
FIG. 9 is an isometric view of one embodiment of an insulator interface in cross-section attached to a circuit card assembly of the present disclosure showing a busbar after being folded into place.

FIG. 9 is a cross section taken through the middle of insulator interface 10 mounted with the busbar 52 fully mounted in place. The curvature of the arcuate surface 34 provides a forming surface to fold the busbar onto the terminal connection 48 in order to make a complete electrical contact. A complete contact is achieved by the surface 58 of the busbar 52 being flush with the surface 60 of terminal connection 48. The radius of curvature of arcuate surface 34 may be varied based on the factors such as the thickness of the circuit board 40, the size of the terminal connection 48 and the location of the terminal connection 48.

Figure 10A:
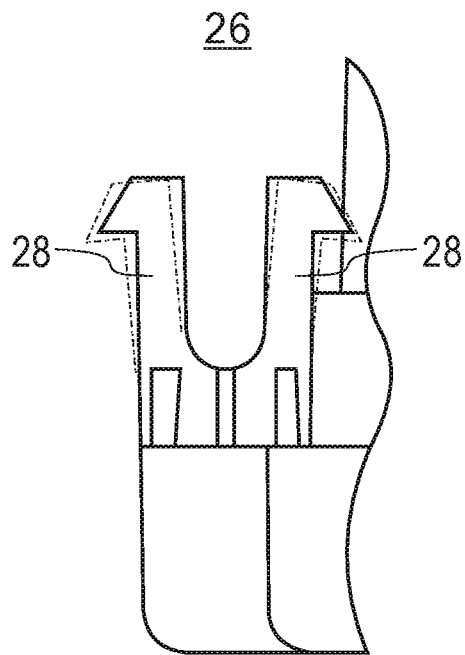
FIG. 10A is a cross-sectional view of the connector of an insulator interface having posts the same length.
Figure 10B:
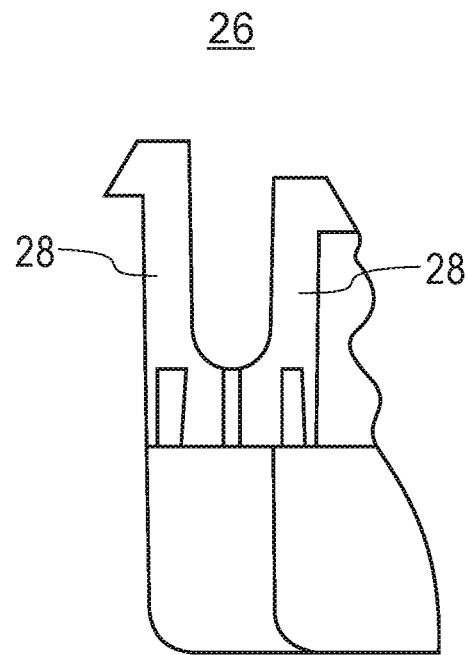
In FIG. 10B is a cross-sectional view of the connector of an insulator interface having posts with different lengths.
Figure 11:
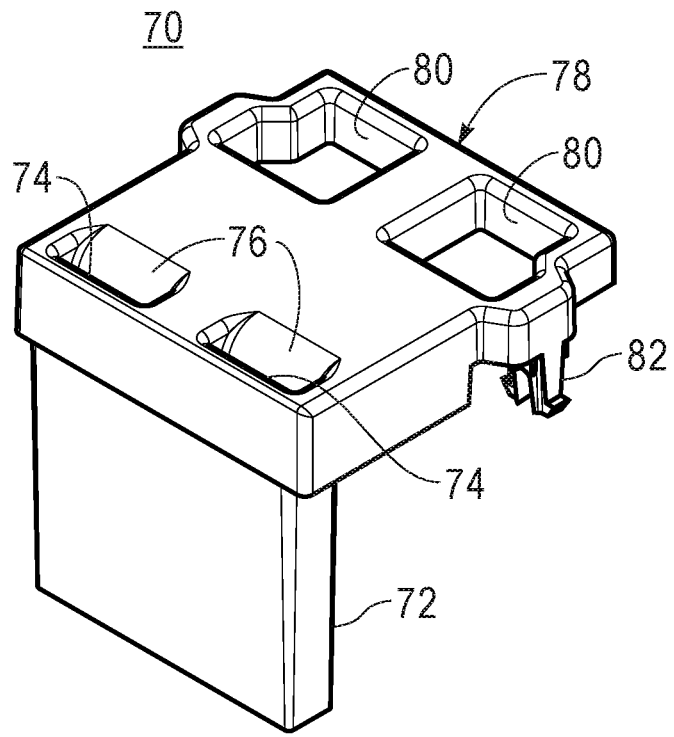
FIG. 11 is an isometric view of one embodiment of an insulator interface of the present disclosure.

FIG. 10A and FIG. 10B show alternative embodiments of the posts 28. In FIG. 10A, the posts 28 are the same length. In FIG. 10B the posts 28 have different lengths to accommodate circuit boards with varying thicknesses. FIG. 11 depicts and alternative embodiment in which the insulator interface 70 can accommodate two busbars. As shown in FIG. 11, riser 72 has two channels 74 with two forming surfaces 76. The insulator interface 70 also includes a terminal locating section 78 with two openings 80 and two connectors (one not shown).

Figure 12:
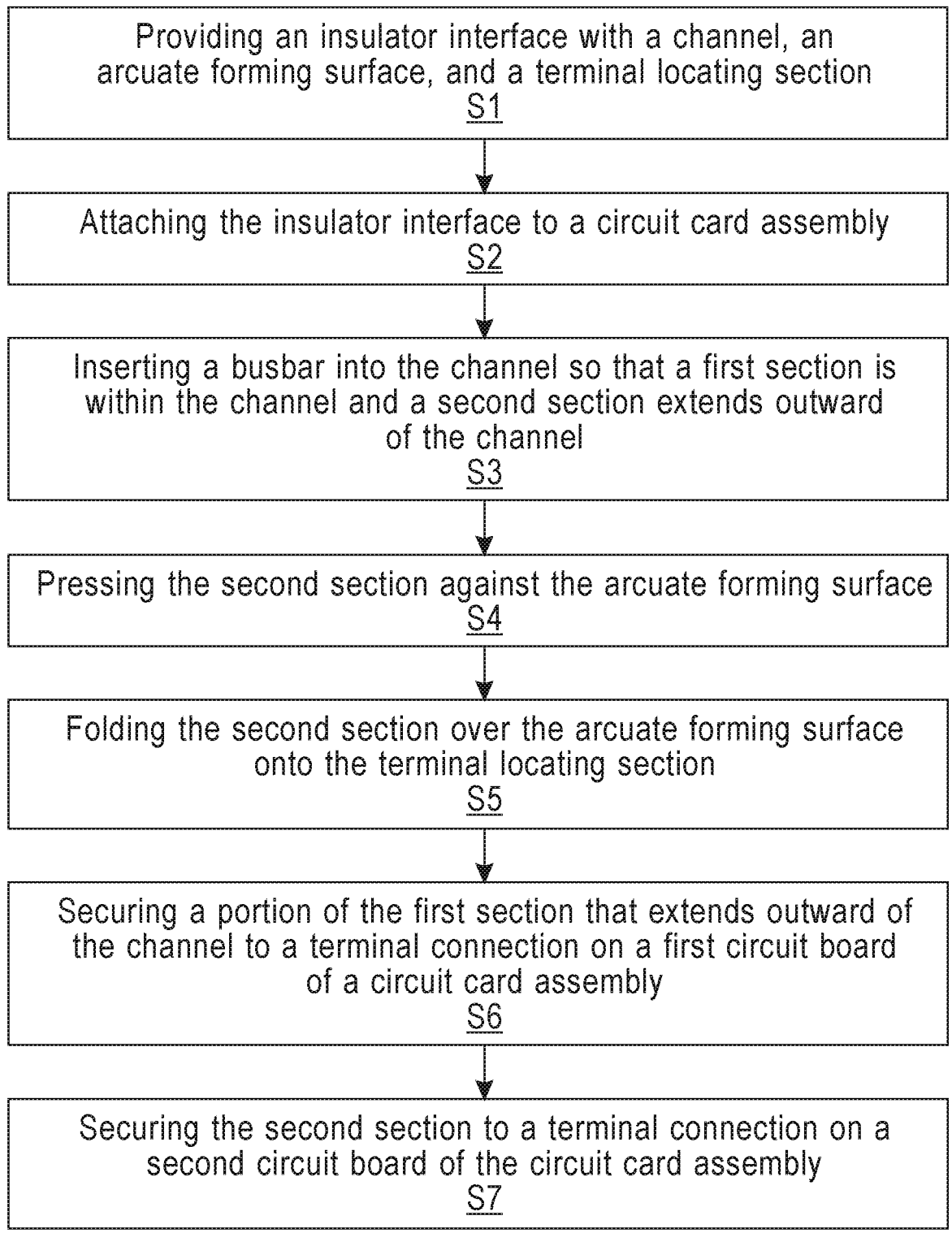
FIG. 12 is a flow chart of one embodiment of a method of installing a busbar assembly onto a circuit card assembly of the present disclosure.

FIG. 12 is a flow chart of one embodiment of a method of installing a busbar assembly onto a circuit card assembly. Step S1 is providing an insulator interface with a channel, an arcuate forming surface, and a terminal locating section.

Step S2 is attaching the insulator interface to the circuit card assembly using the connector.

Step S3 is inserting a busbar having a first section and a second section into the channel so that the first section of the busbar is within the channel and extends outward of the channel from the first opening and the second section of the busbar extends outward of the channel from the second opening.

Step S4 is pressing the second section against the arcuate forming surface and step S5 is folding the second section over the arcuate forming surface onto the terminal locating section.

S6 is securing a portion of the first section that extends outward of the channel to a terminal connection on a first circuit board of a circuit card assembly and step S7 is securing the second section to a terminal connection on a second circuit board of the circuit card assembly.

In one embodiment, the insulator interface may be fabricated as a single unitary piece. In one embodiment, the insulator interface may be made of any material that can be fabricated by injection molding or additive manufacturing and act as an insulator. In one embodiment, the insulator interface material may be made of polypropylene, such as general purpose unfilled polypropylene. In one embodiment, the busbar is a single piece metal, such as copper, brass and aluminum. The combination of the single piece busbar and insulator interface creates a technically effective, low cost, and easy to install solution.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A busbar insulator interface comprising:
    a hollow riser having at least one channel extending between first and second openings at opposite ends of the riser;
    a busbar forming section located at one of the first and second openings of the riser;
    a terminal locating section extending from the busbar forming section,
    wherein the busbar forming section is configured for folding a busbar onto the terminal locating section;
    a connector for attaching the insulator interface to an electrical assembly, wherein the connector is located on the terminal locating section and comprises a pair of posts extending from the terminal locating section, and wherein each of the posts has a boss extending outward from each post.

2. The busbar insulator interface of claim 1, wherein the terminal locating section extends at a right angle from the riser such that the insulator interface has an L-shape.

3. The busbar insulator interface of claim 1, wherein the terminal locating section includes an aperture configured for locating and receiving an electrical terminal.

4. The busbar insulator interface of claim 3, wherein the aperture of the terminal locating section includes a wide section and a narrow section.

5. The busbar insulator interface of claim 1, further comprising a plurality of ribs extending outward from the posts.

6. The busbar insulator interface of claim 1, wherein the busbar forming section comprises a surface of the at least one channel.

7. The busbar insulator interface of claim 6, wherein the surface of the busbar forming section has an arcuate cross sectional shape.

8. The busbar insulator interface of claim 6, wherein the surface of the busbar forming section has a curvature configured for folding a busbar onto the terminal locating section.

9. The busbar insulator interface of claim 1, wherein the hollow riser has two channels, each channel extending between respective first and second openings at opposite ends of each channel.

10. The busbar insulator interface of claim 9, wherein each channel has a busbar forming section located at one of the first and second openings of the riser.

11. The busbar insulator interface of claim 10, wherein the terminal locating section includes a pair of apertures, each aperture configured for locating and receiving an electrical terminal.

12. A busbar assembly comprising:
    insulator interface comprising:
        a hollow riser having a channel extending between first and second openings at opposite ends of the riser;
        a busbar forming section located at one of the first and second openings of the riser, wherein the busbar forming section comprises a surface of the channel; and
        a terminal locating section extending from the busbar forming section; and
    a busbar having a first section extending through the channel and a second section folded over the busbar forming section,
    wherein the busbar forming section is configured for folding the busbar onto the terminal locating section, and wherein the surface of the busbar forming section has an arcuate cross sectional shape.

13. The busbar assembly of claim 12, wherein the busbar is a single piece of metal.

14. A method of installing a busbar assembly onto a circuit card assembly comprising:
    providing an insulator interface, the insulator interface comprising a hollow riser having a channel extending between first and second openings at opposite ends of the riser, a busbar forming section located at one of the first and second openings of the riser and a terminal locating section extending from the busbar forming section, terminal locating section having a connector for attaching the insulator interface to a circuit card assembly;
    attaching the insulator interface to the circuit card assembly using the connector;
    inserting a busbar having a first section and a second section into the channel so that the first section of the busbar is within the channel and extends outward of the channel from the first opening and the second section of the busbar extends outward of the channel from the second opening;
    folding the second section of the busbar over the busbar forming section onto the terminal locating section; and
    pressing the second section of the busbar against an arcuate surface of the busbar forming section.

15. The method of installing a busbar assembly of claim 14, wherein the arcuate surface has a curvature configured to be used as a forming surface for folding the busbar onto the terminal locating section.

16. The busbar assembly of claim 12, wherein the terminal locating section extends at a right angle from the riser such that the insulator interface has an L-shape.

17. The busbar assembly of claim 12, wherein the terminal locating section includes an aperture configured for receiving an electrical terminal.

18. The busbar assembly of claim 12, further comprising a connector for attaching the insulator interface to an electrical assembly.

19. The busbar assembly of claim 18, wherein the connecter comprises a pair of posts extending from the terminal locating section.

20. The busbar assembly of claim 19, wherein each of the posts has a boss extending outward from each post.

* * * * *